(12) United States Patent
Kondo

(10) Patent No.: US 11,614,492 B2
(45) Date of Patent: Mar. 28, 2023

(54) METHODS AND APPARATUS FOR A BATTERY

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 295 days.

(21) Appl. No.: 16/949,522

(22) Filed: Nov. 2, 2020

(65) Prior Publication Data

US 2022/0137141 A1 May 5, 2022

(51) Int. Cl.
| | |
|---|---|
| *G01R 31/374* | (2019.01) |
| *G01R 19/165* | (2006.01) |
| *H01M 10/44* | (2006.01) |
| *G01R 31/3842* | (2019.01) |
| *H02J 7/00* | (2006.01) |
| *G01R 31/388* | (2019.01) |

(52) U.S. Cl.
CPC ..... *G01R 31/374* (2019.01); *G01R 19/16542* (2013.01); *G01R 31/388* (2019.01); *G01R 31/3842* (2019.01); *H01M 10/448* (2013.01); *H02J 7/00041* (2020.01)

(58) Field of Classification Search
CPC ............ G01R 31/374; G01R 19/16542; G01R 31/3842; G01R 31/388; G01R 31/389; H01M 10/448; H02J 7/00041; H02J 7/00306; H02J 7/00712; Y02E 60/10

USPC .......................................................... 320/132
See application file for complete search history.

(56) References Cited

U.S. PATENT DOCUMENTS

| | | | | | |
|---|---|---|---|---|---|
| 5,396,163 | A | * | 3/1995 | Nor ................... | H02J 7/007182 320/159 |
| 5,900,718 | A | * | 5/1999 | Tsenter ............... | H02J 7/00712 320/152 |
| 7,928,735 | B2 | * | 4/2011 | Huang ................... | B60L 58/15 324/426 |
| 10,310,024 | B2 | * | 6/2019 | Kondo ................ | H01M 10/425 |
| 10,516,284 | B2 | * | 12/2019 | Maalouf ................. | H02M 3/07 |
| 2003/0231002 | A1 | | 12/2003 | Johnson | |
| 2005/0127879 | A1 | | 6/2005 | Sato | |
| 2005/0134230 | A1 | | 6/2005 | Sato | |
| 2008/0048621 | A1 | | 2/2008 | Yun | |
| 2010/0244847 | A1 | | 9/2010 | Kudo | |
| 2013/0334881 | A1 | | 12/2013 | Jones | |
| 2014/0159739 | A1 | | 6/2014 | Kudo | |
| 2014/0203762 | A1 | | 7/2014 | Kato | |

(Continued)

FOREIGN PATENT DOCUMENTS

| | | | | | |
|---|---|---|---|---|---|
| EP | 3164727 | B1 | * 3/2022 | .......... | G01R 31/387 |
| KR | 20050070192 | A | * 7/2005 | .............. | H02J 7/007 |

*Primary Examiner* — M Baye Diao
(74) *Attorney, Agent, or Firm* — Dickinson Wright PLLC

(57) ABSTRACT

Various embodiments of the present technology may provide methods and apparatus for a battery. The apparatus may provide a fuel gauge circuit that operates in conjunction with a charger to perform a pre-charging operation of the battery in the event the battery has experienced an over-discharge. The pre-charging operation is defined by a period of time selected according to a measured state of charge and/or an internal resistance of the battery.

20 Claims, 7 Drawing Sheets

(56) References Cited

U.S. PATENT DOCUMENTS

| | | | |
|---|---|---|---|
| 2014/0253041 A1* | 9/2014 | Takeda | H01M 10/42 |
| | | | 320/134 |
| 2016/0079789 A1 | 3/2016 | Kato | |
| 2016/0301224 A1 | 10/2016 | Kondo | |
| 2016/0303977 A1 | 10/2016 | Kudo | |
| 2016/0380461 A1 | 12/2016 | Jones | |
| 2017/0077729 A1 | 3/2017 | Sato | |
| 2017/0288417 A1* | 10/2017 | Trichy | G01R 31/3842 |
| 2018/0083467 A1 | 3/2018 | Sato | |
| 2018/0262027 A1 | 9/2018 | Jung | |
| 2019/0033378 A1* | 1/2019 | Kondo | H01M 10/425 |
| 2019/0212395 A1 | 7/2019 | Chen | |
| 2019/0356135 A1* | 11/2019 | Kalam | H02J 7/0071 |
| 2020/0127482 A1 | 4/2020 | Ding | |
| 2020/0177002 A1 | 6/2020 | Kondo | |
| 2020/0328608 A1* | 10/2020 | Song | G01R 31/36 |
| 2021/0296920 A1* | 9/2021 | Matsuda | H02J 7/0047 |
| 2021/0391603 A1* | 12/2021 | Kawakami | H02J 7/0048 |
| 2021/0391740 A1* | 12/2021 | Kondo | H02J 7/00306 |

* cited by examiner

| Over-Discharge SOC [%] | Resistance (increase) [m Ohm] | Pre-charge time for recover [seconds] |
|---|---|---|
| -1.0 | 10.0 | 15000.0 |
| -1.5 | 13.0 | 16000.0 |
| -2.0 | 16.0 | 17500.0 |
| -2.5 | 17.0 | 19000.0 |
| -3.0 | 18.0 | 21500.0 |
| -3.5 | 18.5 | 23500.0 |
| -4.0 | 19.0 | 26000.0 |
| -4.5 | 19.5 | 29000.0 |
| -5.0 | 20.0 | 31500.0 |
| -5.5 | 22.0 | 34800.0 |
| -6.0 | 24.0 | 38000.0 |

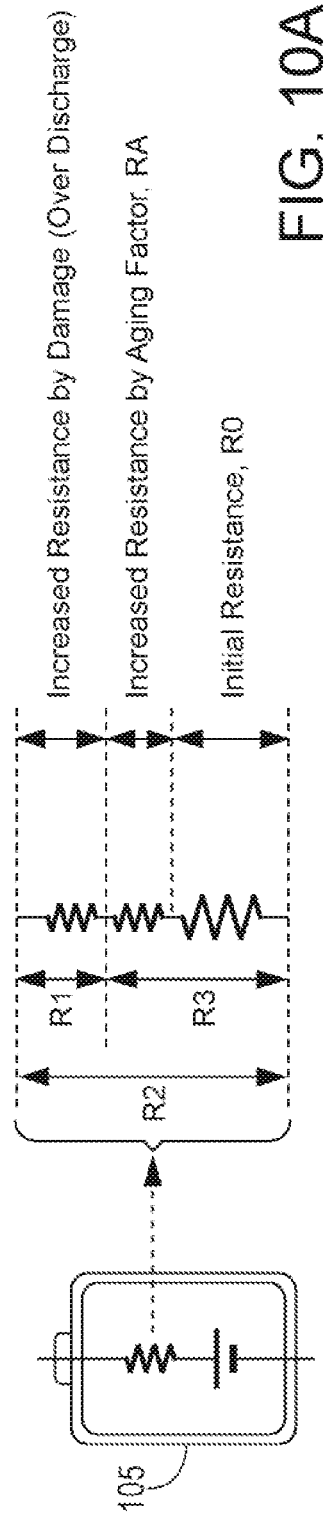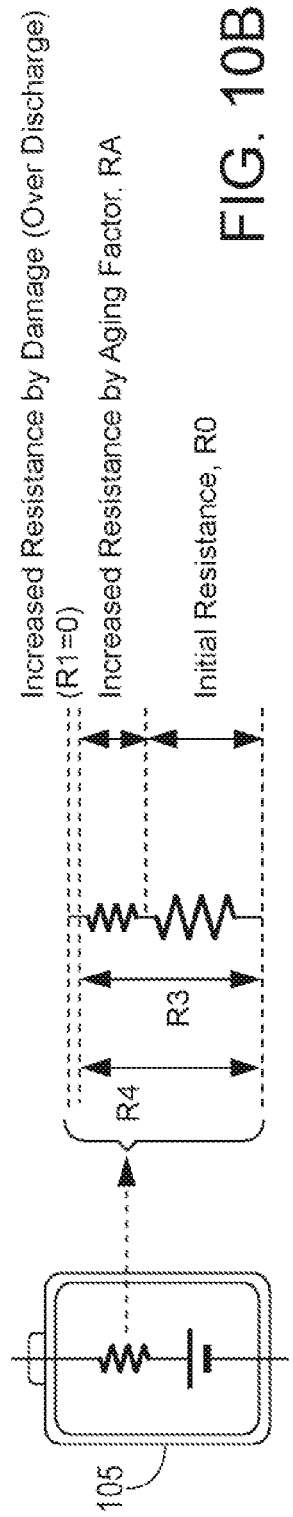
FIG. 10A
FIG. 10B

METHODS AND APPARATUS FOR A BATTERY

BACKGROUND OF THE TECHNOLOGY

"Battery capacity" is a measure of the amount of electric charge stored by a battery. Battery capacity is determined by the mass of active material contained in the battery and is typically measured in units of ampere hours. The battery's present capacity (i.e., relative state of charge) is the amount of electric charge stored by the battery relative to its capacity and is typically expressed as a percentage of the battery's maximum capacity. The battery's maximum capacity represents the maximum amount of energy that can be extracted from the battery under certain specified conditions. The actual energy storage capabilities of the battery, however, can vary significantly from its "nominal" rated capacity.

One factor that may affect the battery capacity is the amount of discharging that the battery experiences. In many applications, if the battery capacity and battery voltage drop below a particular threshold, the system (and an electronic device being powered by the battery) will automatically enter a stand-by state or sleep mode, in which the battery stops conducting and the electronic device becomes inoperable. This will prevent the battery from over-discharging. However, in some instances (e.g., to make an emergency 911 call), it may be desirable to force the electronic device out of the stand-by state/sleep mode, which may cause the battery to over-discharge. A battery may be said to be over-discharged if the battery's open circuit voltage drops below a threshold voltage or the battery's state of charge value drops below zero. Over-discharging can reduce the battery's effective capacity by 1% to 5%. For lower-rated batteries, this loss in capacity can reduce the overall life of the battery. Therefore, it may be desired to recover the loss in capacity to extend the life of the battery.

SUMMARY OF THE INVENTION

Various embodiments of the present technology may provide methods and apparatus for a battery. The apparatus may provide a fuel gauge circuit that operates in conjunction with a charger to perform a pre-charging operation of the battery in the event the battery has experienced an over-discharge. The pre-charging operation is defined by a period of time selected according to a measured state of charge and/or an internal resistance of the battery.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 is a block diagram of a battery system in accordance with an exemplary embodiment of the present technology;

FIG. 2 representatively illustrates ideal battery capacity range, over-charge, and over-discharge within a battery in accordance with an exemplary embodiment of the present technology;

Figures 6, 7:
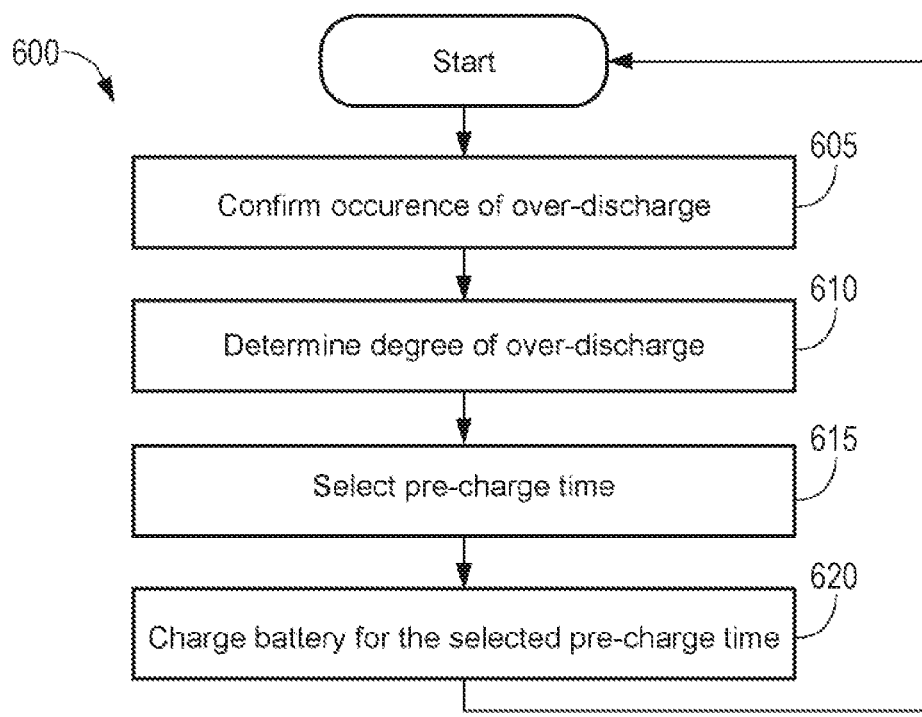
FIG. 6 is a flow chart for restoring a loss in capacity of a battery.
Figure 8:
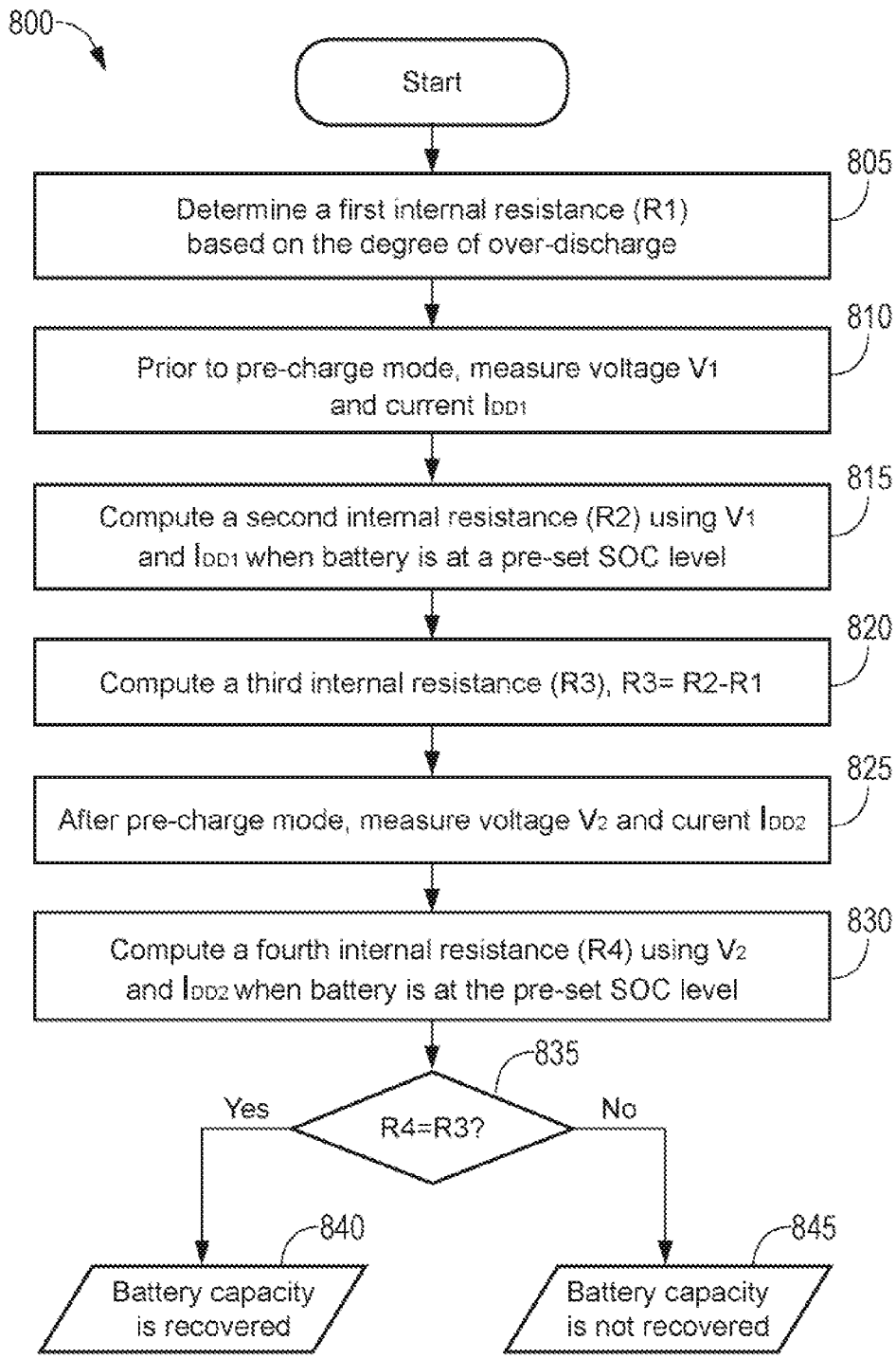
Figure 9:
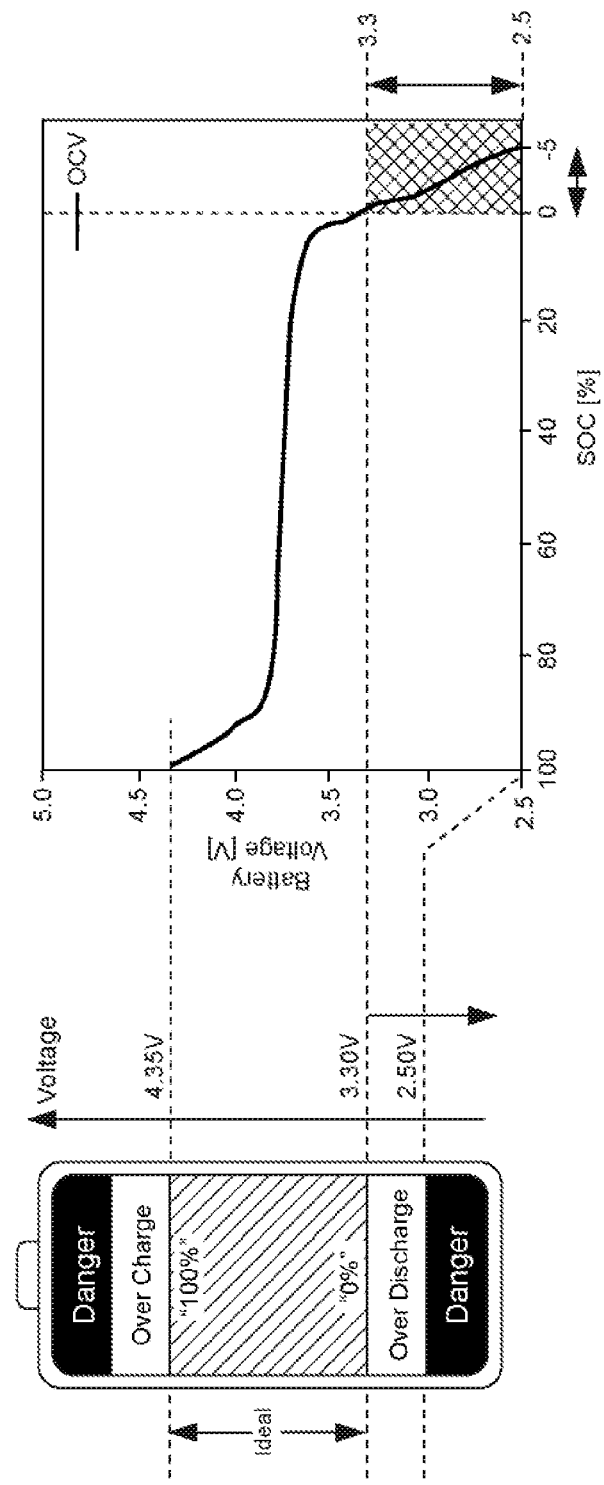

FIG. 7 representatively illustrates a data table in accordance with an exemplary embodiment of the present technology;

FIG. 8 is a flow chart for confirming battery capacity recovery in accordance with an exemplary embodiment of the present technology;

FIG. 9 representatively illustrates over-discharge as it relates to battery capacity and open circuit voltage values in accordance with an exemplary embodiment of the present technology;

FIG. 10A representatively illustrates the internal resistance of a battery before recovery; and FIG. 10B representatively illustrates the internal resistance of a battery after recovery.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portable electronic devices, wearable electronic devices, and consumer electronics, and the systems described are merely exemplary applications for the technology.

Figure 1:
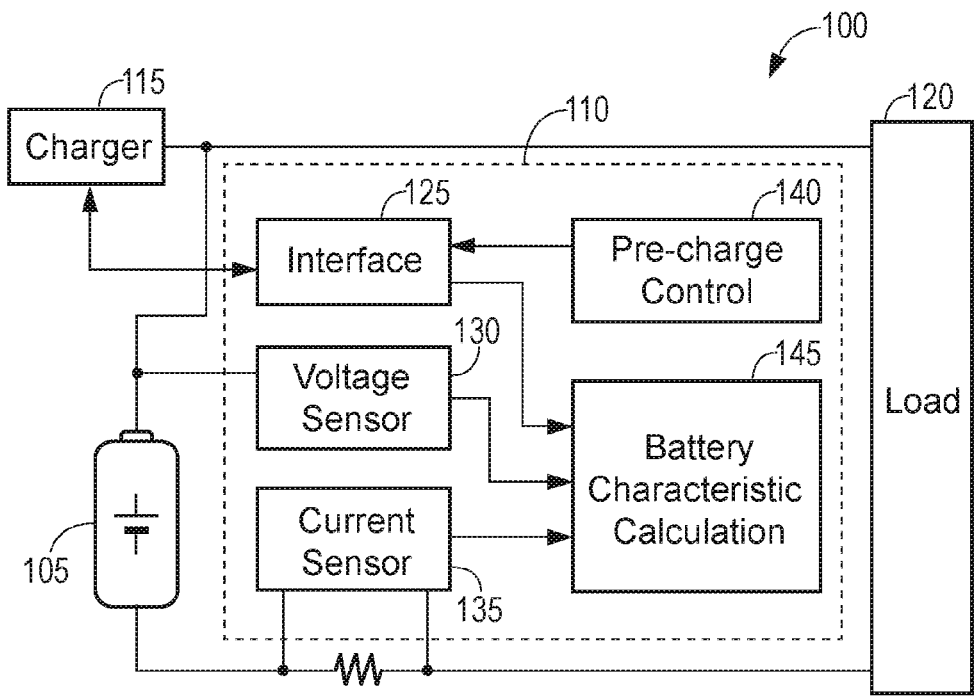

Methods and apparatus for a battery according to various aspects of the present technology may operate in conjunction with any suitable electronic system and/or device, such as "smart devices," wearables, battery-powered consumer electronics, portable devices, and the like. Referring to FIG. 1, a system 100 may comprise a battery 105, a charger 115, a fuel gauge circuit 110, and a host system 120 (i.e., a load). The battery 105, the fuel gauge circuit 110, and the host system 120 may be integrated in an electronic device (not shown), such as a smart watch or head phones.

In an exemplary embodiment, the battery 105 may be a rechargeable battery (e.g., a lithium ion battery or other rechargeable battery type) that provides power to the host system 120. In various embodiments, the capacity of the battery 105 and/or voltage of the battery 105 may be increased by the charger 115 during a charging operation.

The charger 115 may be configured to control charging of the battery 105. The charger 115 may be configured to physically connect/disconnect to/from the battery 105. The charger 115 may comprise any circuit and/or system suitable for controlling current supplied to the battery 105 for the purpose of charging the battery 105.

In an exemplary embodiment, the charger 115 may provide various charging modes/schemes, such as a pre-charge mode, a constant current charge mode, and a constant voltage charge mode. In general, during the constant current charge mode, the charger 115 charges the battery 105 at a constant current until the battery 105 reaches a predetermined voltage. During the constant voltage charge mode, the charger 115 charges the battery 105 at a constant voltage (the current decreases during this time). The constant current charge mode and the constant voltage charge mode may be referred to as normal charge modes, in that the length of charging time and the magnitude of the charge current are established for ideal battery operating conditions. For example, during the constant current charge mode or the constant voltage charge mode, the charger 115 may provide a charge rate of 1 C, meaning that it takes one hour to charge a battery rated at 1 Ah to 100% capacity by providing the battery with 1 A of charging current. The charge rates for the normal charge modes are determined according to the particular battery characteristics and specifications.

In an exemplary embodiment, the pre-charge mode may be performed immediately prior to the constant current charge mode and at a rate substantially lower than the normal charge rate of 1 C. For example, during the pre-charge mode, the charger 115 may charge the battery at rates of 0.01 C, 0.02 C, 0.001 C, and the like. The charge rate during the pre-charge mode may be constant (e.g., a constant 0.01 C) or may vary (e.g., the battery may be charged at 0.01 C for a period of time and then charge at 0.001 C for a period of time).

The fuel gauge circuit 110 may be configured to manage various battery operations and monitor various battery conditions. For example, the fuel gauge circuit 110 may be configured to measure a voltage $V_B$ of the battery 105, measure a current of the battery 105, compute a remaining capacity (also expressed as a percentage and referred to as a state of charge (SOC)) of the battery 105, compute a state of health (SOH) of the battery 105, estimate a lifespan of the battery 105, determine an energy capability of the battery 105, and the like.

Figure 2:
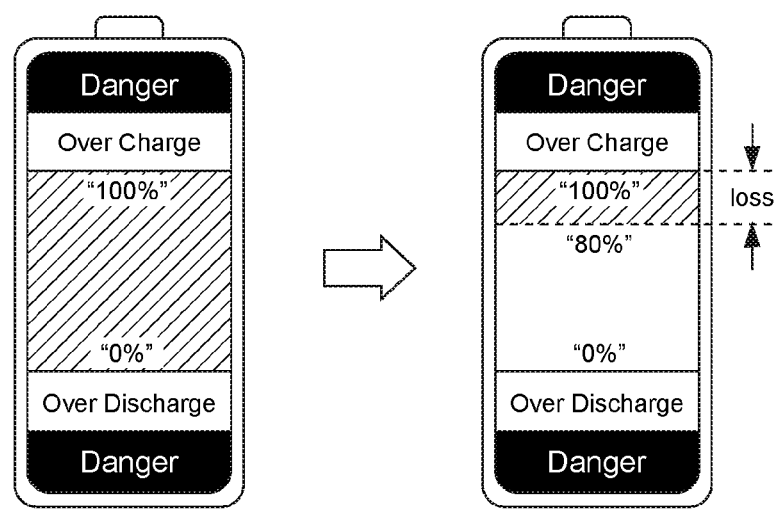

In various embodiments, and referring to FIG. 2, the fuel gauge circuit 110 may be further configured to detect over-discharge conditions (i.e., an excessively low open circuit voltage and/or a low SOC during a discharging operation) and over-charge conditions (i.e., an excessively high battery voltage during a charging operation).

In an exemplary embodiment, the fuel gauge circuit 110 may comprise a voltage sensor 130, a current sensor 135, a battery characteristic calculation (BCC) circuit 145, a pre-charge control circuit 140, and an interface 125.

In various embodiments, the fuel gauge circuit 110 may further comprise a timer (not shown) to measure or otherwise track time. The timer may be started, stopped, and reset according to various control signals. The timer may comprise any suitable conventional timer.

In an exemplary embodiment, the voltage sensor 130 may be configured to measure the voltage $V_B$ of the battery 105. The voltage sensor 130 may be connected to the battery 105 and may comprise any circuit and/or device suitable for measuring a voltage potential of the battery 105.

The current sensor 135 may be configured to measure or otherwise sense the current of the battery 105. The current sensor 135 may comprise any circuit and/or device suitable for measuring the current of the battery 105. For example, the current sensor 135 may operate in conjunction with a sense resistor connected to a negative terminal of the battery 105, wherein the current sensor 135 measures the voltage potential across the sense resistor to determine the current.

Figure 4:
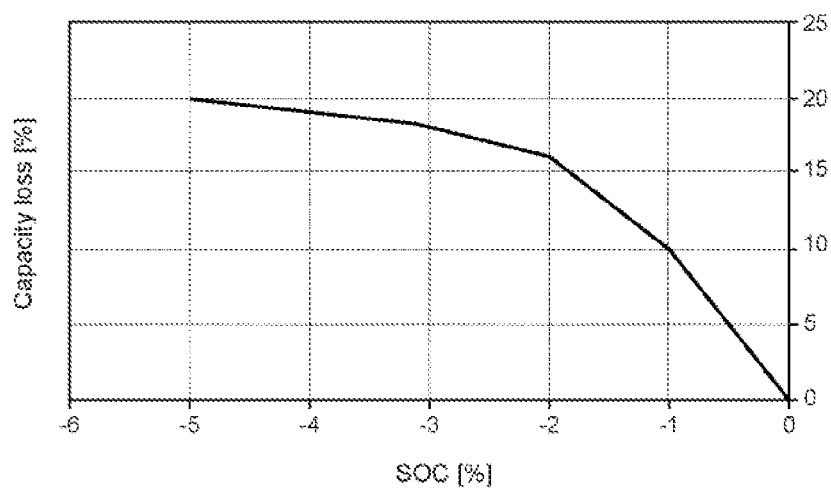
FIG. 4 is a graph illustrating battery capacity loss versus SOC in accordance with an exemplary embodiment of the present technology.

The fuel gauge circuit 110 may further comprise a memory (not shown) to store known battery characteristic data and profile data of the battery 105. For example, the memory may store capacity loss values and corresponding SOC values (e.g., as illustrated in FIG. 4), open circuit voltage values and corresponding SOC values (e.g., as illustrated in FIG. 9), and SOC values and corresponding pre-charge time values (e.g., as illustrated in FIG. 7). The various data sets may be stored in a look-up table or any other data storage solution suitable for storing relational data.

In various embodiments, the memory may also store measured and/or computed values, such as measured voltage data from the voltage sensor 130, measured current data from the current sensor 135, computed SOC values (both currently-computed and past values), computed internal resistance values, and the like.

The memory may comprise any suitable memory type, such as ROM (read only memory) and/or RAM (random access memory), and comprise any suitable number of memory cells.

The BCC circuit 145 may perform various computations, carry out programmed instructions, perform logic functions, and the like, according to known or other computed values.

In an exemplary embodiment, the BCC circuit 145 may be configured to compute the remaining capacity (also referred to as the "state of charge" (SOC) and expressed as a percentage) of the battery 105 using the detected current of the battery 105 and/or the voltage of the battery 105. For example, the BCC circuit 145 may be configured to integrate the current of the battery 105 over a period of time. This may be accomplished using the current sensor 135 and tracking the current during charging and discharging operations. In one embodiment, the BCC circuit 145 may compute the SOC according to the following:

$$SOC_t = SOC_{t_0} + \int_{t_0}^{t} \frac{\eta I}{C_n} dt$$

where $SOC_t$ is the estimated SOC at time t, $SOC_{t0}$ is the initial SOC when the estimation process starts, I is the current of the battery 105, η is the current efficiency, and $C_n$ is the nominal capacity of the battery 105. When the battery 105 is charging, the current I is a positive number and when the battery is discharging, the current I is a negative number. Accordingly, if the battery discharges long enough, the SOC becomes a negative value. In general, utilizing the measured battery current to determine the remaining capacity is referred to as "coulomb counting."

Alternatively, or in addition to using the current, the BCC circuit 145 may compute the remaining capacity of the battery 105 using the measured battery voltage from the voltage sensor 130. In some embodiments, this may be accomplished by measuring an open circuit voltage of the battery 105 (when the battery is neither charging nor discharging) and selecting a corresponding remaining capacity value, such as from a look-up table (e.g., as illustrated in FIG. 9). In general, utilizing the measured open circuit voltage to determine the remaining capacity of the battery is referred to as the "voltage method."

In addition, the BCC circuit 145 may be in communication with the interface 125, the voltage sensor 130, the current sensor 135, and the pre-charge control circuit 140. The BCC circuit 145 may be configured to receive and utilize the data from the voltage sensor 130 and the current sensor 135 to compute or determine other variables and/or generate various signals. For example, the BCC circuit 145 may use voltage value data from the voltage sensor 130 and/or current value data from the current sensor 135 to compute the state of charge (SOC) of the battery 105. In addition, the BCC circuit 145 may use the voltage value data from the voltage sensor 130 and the current value data from the current sensor 135 to compute a resistance value (e.g., using Ohm's law).

The BCC circuit 145 may be configured to communicate with the memory. For example, the BCC circuit 145 may extract or otherwise retrieve data from the memory, such as previously-computed SOC values, previously-computed internal resistance values, predetermined battery characteristic data, and the like.

The BCC circuit 145 may comprise any number of circuits, systems, and/or logic gates to perform the desired functions, as described above. For example, the BCC circuit 145 may comprise a field programmable gate array, an application specific integrated circuit, and the like.

The pre-charge control circuit 140 may be configured to initiate the pre-charge mode. In an exemplary embodiment, the pre-charge control circuit 140 may receive information or signals from the BCC circuit 145 corresponding to the computed SOC values and/or the computed internal resistance values of the battery 105. In addition, the pre-charge control circuit 140 may receive a count value from the timer.

In an exemplary embodiment, the pre-charge control circuit 140 may generate various charge control signals and transmit the charge control signals to the charger 115 via the interface 125. The charge control signals may indicate to the charger 115 that the charger 115 should start or stop the pre-charge mode. For example, the pre-charge control circuit 140 may be configured to determine whether the pre-charge mode is appropriate based on an over-discharge history of the battery 105. The pre-charge control circuit 140 may be further configured to determine the duration of the pre-charge mode. In such a case, the pre-charge control circuit 140 may transmit a charge control signal to the charger 115 indicating that the pre-charge mode should commence or that the pre-charge mode should end.

In various embodiments, the pre-charge control circuit 140 may be communicatively coupled to the BCC circuit 145 and configured to receive the computed SOC values and/or computed internal resistance values of the battery 105. In addition, the pre-charge control circuit 140 may be communicatively coupled to the timer to receive the count value. Further, the pre-charge control circuit 140 may have access to the memory to extract or otherwise retrieve relevant data from the memory.

The pre-charge control circuit 140 may comprise any number of circuits, systems, and/or logic gates to perform the desired functions, as described above. For example, the pre-charge control circuit 140 may comprise a field programmable gate array, an application specific integrated circuit, and the like. In various embodiments, the pre-charge control circuit 140 and the BCC circuit 145 may be integrated together on one chip. In other embodiments, the pre-charge control circuit 140 and the BCC circuit 145 may be integrated on separate chips.

The fuel gauge circuit 110 may further comprise the interface 125 which may be configured to facilitate communication between the fuel gauge circuit 110 and the charger 115. For example, the interface 125 may support an $I^2C$ communication protocol and connect the fuel gauge circuit 110 to the charger 115 with an $I^2C$ communication bus.

The interface 125 may send and receive information regarding charging operations to/from the charger 115. For example, the interface 125 may facilitate transmission of the charge control signals (used to start/stop the pre-charge mode) from the pre-charge control circuit 140. In addition, the interface 125 may facilitate communication between the charger 115 and the BCC circuit 145. For example, the charger 115 may provide information to the BCC circuit 145 regarding whether the battery 105 has begun charging and the type of charge mode (i.e., the pre-charge mode, the constant current charge mode, or the constant voltage charge mode).

In various embodiments, the system 100 may further comprise a temperature sensor (not shown), such as a thermistor, suitably configured to monitor and report a temperature of the battery 105. For example, the temperature sensor may generate a voltage that corresponds to a temperature of the battery 105 and transmit the voltage to the fuel gauge circuit 110. The fuel gauge circuit 110 may use the measured temperature to estimate the state of charge, the internal resistance, and any other parameters of the battery 105 that may be affected by temperature.

Figure 3:
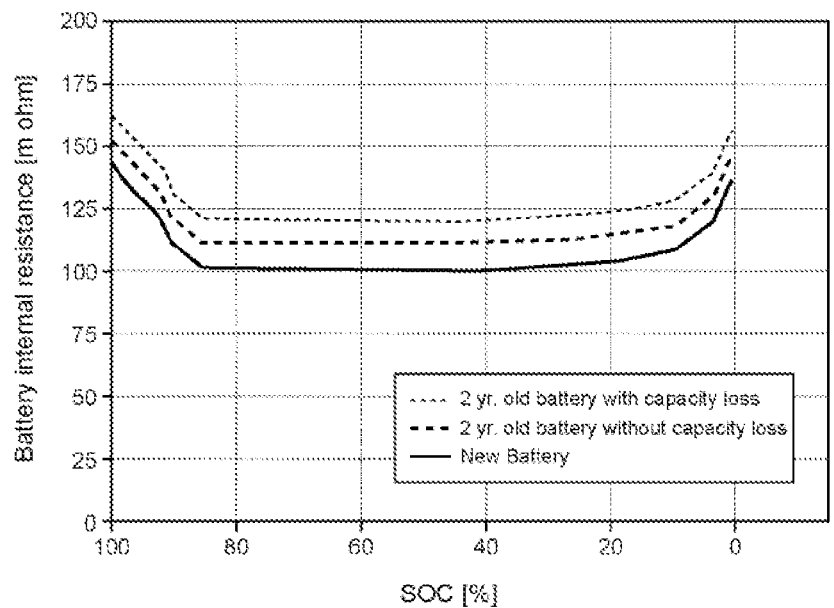
FIG. 3 is a graph illustrating internal resistance versus SOC at various stages during the life of a battery in accordance with an exemplary embodiment of the present technology.

During its lifespan, the battery 105 may experience a loss in capacity due to general aging, such as cycle aging and/or calendar aging. A new battery has an initial internal resistance R0, but as the battery ages, the internal resistance R0 increases across all SOC values (e.g., as illustrated in FIG. 3), thereby reducing the effective battery capacity from its nominal rated capacity. This loss of capacity due to aging is, generally, not reversible. In addition, a battery may undergo a loss in capacity due to over-discharging, in which the battery is discharged to an undesirable level. In particular, when the SOC value of a battery drops below zero, the internal resistance of the battery increases, thereby reducing the effective battery capacity (e.g., as illustrated in FIG. 2). It has been observed that loss of capacity due to over-discharging is reversible.

Generally, during a normal operation, the fuel gauge circuit 110 continually monitors the voltage and current of the battery 105 and continually computes the SOC of the battery 105. Each time the fuel gauge circuit 110 detects or computes a new voltage value, current value, SOC value, and the like, it stores the values in the memory. The memory may store a number of sequential values for each variable, which may be accessed at a later time.

Figure 5A:
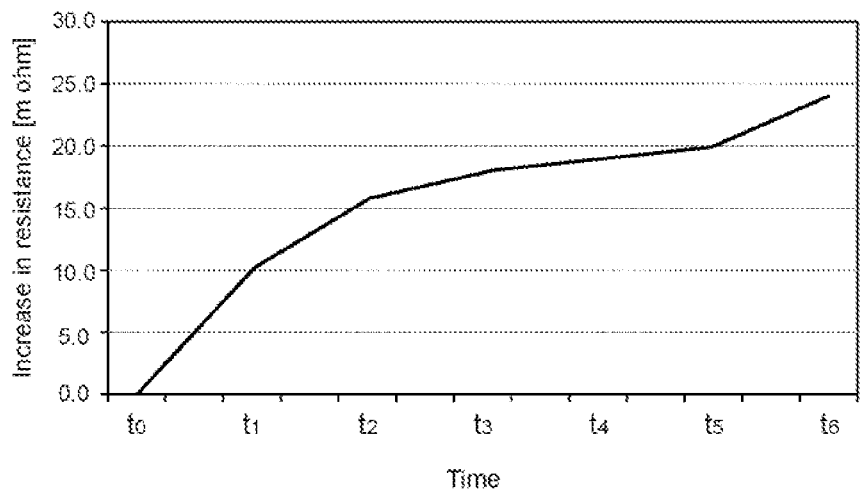
FIG. 5A is a graph illustrating internal resistance over time in accordance with an exemplary embodiment of the present technology.
Figure 5B:
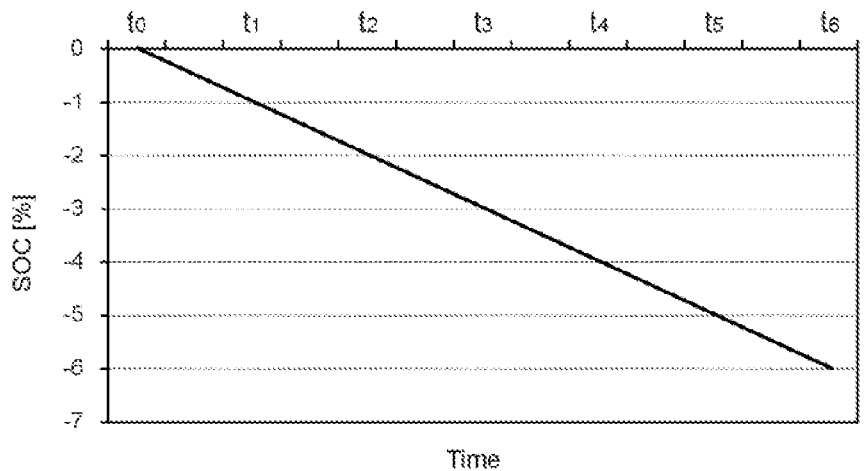
FIG. 5B is a graph illustrating SOC over time in accordance with an exemplary embodiment of the present technology.
Figure 5C:
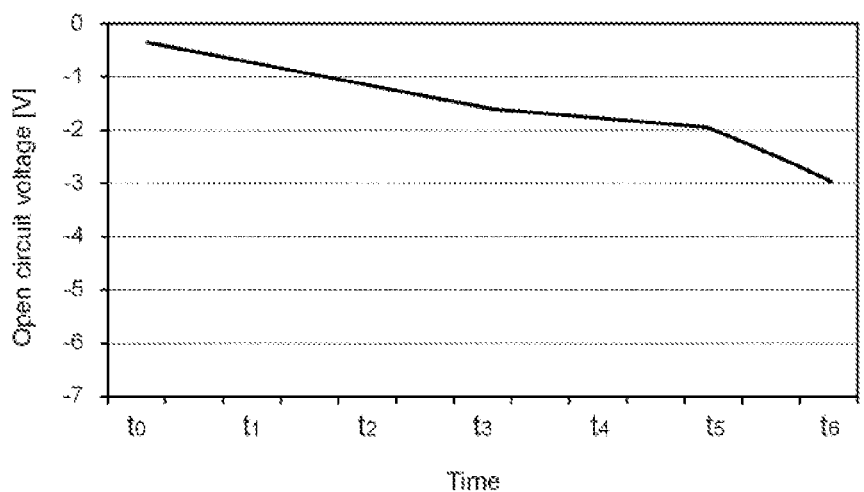
FIG. 5C is a graph illustrating open circuit voltage over time in accordance with an exemplary embodiment of the present technology.

At some time during operation, the battery 105 may be over-discharged, which may occur if the SOC value of the battery 105 is less than zero and/or when an open circuit voltage of the battery 105 is less than a predetermined value (e.g., 3.3V). The predetermined value is may be determined according to the particular specifications and characteristics of the battery 105 (e.g., nominal voltage, cut-off voltage, nominal capacity, nominal energy, cycle life, specific energy, specific power, energy density, power density, maximum continuous discharge current, recommended charge current, and the like). The battery 105 may be over-discharged as a result of performing an emergency function of the electronic device (e.g., an emergency call on a mobile phone). The over-discharge increases the internal resistance of the battery 105, which reduces its effective capacity, thereby reducing the overall life of the battery 105. For example, and referring to FIGS. 5A-5C, the SOC value is proportional to the open circuit voltage of the battery 105, and both the SOC value and the open circuit voltage are inversely proportional to an increase in the internal resistance of the battery 105. In addition, as the SOC value drops below zero, the loss of capacity increases (e.g., as illustrated in FIG. 4).

In operation, and referring to FIGS. 1-10, the system 100 restores a loss in capacity of the battery 105 due to over-discharging of the battery 105. In an exemplary operation, the system 100 may confirm the occurrence of an over-discharge event (605). For example, the BCC circuit 145 may set a flag (i.e., indicator variable) to a certain value (e.g., "1") if the BCC circuit 145 detects that the battery 105 was over-discharged. Upon receipt of an inquiry initiated by a user of the system 100, such as by pushing/selecting an option button, the system 100 may identify whether the flag is set to a value corresponding to an over-discharge. In addition or alternatively, the system 100 may periodically (e.g., once a week), and autonomously, start the recovery process by checking the value of the flag.

If the flag indicates that an over-discharge event occurred, the system 100 may determine the degree (i.e., extent) of the over-discharge event (610). For example, upon inquiry by the user, and confirmation of an over-discharge event, the BCC 145 may retrieve one or more SOC values that are stored in the memory and analyze the numerical value of the SOC (e.g., −1, −2, −3, etc.). The SOC values that are less than 0 indicate an over-discharge, and the greater the negative number, the greater the degree of the over-discharge. In addition or alternatively, the BCC 145 may (automatically or upon inquiry by the user) retrieve and analyze previously-measured open circuit voltage values stored in the memory. Open circuit voltage values that are less than a predetermined threshold value (e.g., 3.3V) may indicate an over-discharge, and the lower the number, the greater the degree of the over-discharge.

The fuel gauge circuit 110 may then select one of the pre-charge time values according to the degree of over-discharge (615). For example, the BCC 145 may transmit the SOC value or the open circuit voltage value indicating the over-discharge to the pre-charge control circuit 140. The pre-charge control circuit 140 may extract or retrieve (from a look-up table in the memory) the pre-charge time value that corresponds to the degree of over-discharge. For example, if the SOC value is −3, then the pre-charge control circuit 140 selects 21,500 seconds as the pre-charge time value.

The system 100 may then charge the battery 105 for the selected pre-charge time value (620). For example, the fuel gauge circuit 110, by way of the pre-charge control circuit 140 and the interface 125, may transmit a first charge control signal to the charger 115, wherein the first charge control signal indicates an instruction to begin a pre-charging operation. The charger 115 may continue to charge the battery 105 according to the pre-charging operation until the fuel gauge circuit 110 sends a second charge control signal that indicates an instruction to stop the pre-charging operation. The timer may be used to track the elapsed time and the fuel gauge circuit 110 may be used to transmit the second charge control signal to the charger 115 when the timer reaches the selected pre-charge time value (e.g., 21,500 seconds). During the pre-charging operation, the charger 115 charges the battery 105 at a charge rate that is substantially less than the normal charge rate. In an exemplary embodiment, the charger 115 charges the battery 105 at a constant rate of 0.01 C. In other embodiments, the charger 115 may charge the battery 105 with a variable charge rate, such as 0.01 C for a period of time immediately followed by 0.001 C for a period of time. The charge rate for the pre-charging operation may be determined based on the particular specifications and characteristics of the battery 105 (e.g., nominal voltage, cut-off voltage, nominal capacity, nominal energy, cycle life, specific energy, specific power, energy density, power density, maximum continuous discharge current, recommended charge current, and the like). For example, a battery with a lower-rated nominal capacity may have a pre-charge rate that is less than that of a battery with a higher-rated nominal capacity. At the end of the pre-charging operation, it is assumed that any loss of capacity due to the over-discharge has been recovered.

In some instances, it may be desired to confirm that the pre-charging operation recovered the loss in capacity. In an exemplary embodiment, the fuel gauge circuit 110 may determine a first internal resistance value R1 based on the degree of the over-discharge (805). The first internal resistance R1 represents the increase in the internal resistance of the battery 105 due only to the over-discharge and/or loss in capacity (e.g., as illustrated in FIG. 10A). For example, prior to the pre-charging operation, the BCC 145 may extract or retrieve (from a look-up table) an internal resistance value that corresponds to the degree of over-discharge. For instance, and referring to FIG. 7, if the SOC value was −3 at step 610, then the first internal resistance value R1 is 18.0 m-ohm. This means that the internal resistance of the battery 105 increased (from its initial internal resistance R0) by 18.0 m-ohm due to over-discharging. This increase in internal resistance (R1) is the same across all SOC values (e.g., as illustrated in FIG. 3). The BCC 145 may transmit the computed first internal resistance value R1 to the memory to be stored.

In addition, and prior to the pre-charging operation described above, the system 100 may ensure the battery 105 is at a particular SOC value (e.g., 50%) by charging or discharging the battery 105. Once the battery 105 is at the desired SOC level, the fuel gauge circuit 110 may then measure and store a first voltage $V_1$ and a first current $I_{DD1}$ (810), and compute a second internal resistance value R2 using the first voltage $V_1$ and the first current $I_{DD1}$ (i.e., $R2=V_1/IDD_1$) (815). The second internal resistance represents a total internal resistance of the battery 105 that includes the initial internal resistance R0, the increase in internal resistance due to aging RA, and the increase in internal resistance due to over-discharging R1 (e.g., as illustrated in FIG. 10A). For example, the voltage sensor 130 and the current sensor 135 may measure the battery voltage and current, respectively, and transmit the measured values to the BCC 145, wherein the BCC 145 may perform any relevant computations, such as division or multiplication. The BCC 145 may transmit the computed second internal resistance value R2 to the memory to be stored. The fuel gauge circuit 110 may then compute a third internal resistance value R3 using the first internal resistance value R1 and the second internal resistance value R2, where R3=R2−R1 (820). The third internal resistance value represents a total internal resistance of the battery 105 that only includes the initial internal resistance R0 and the increase in internal resistance due to aging RA (e.g., as illustrated in FIG. 10A). For example, the BCC 145 may perform any relevant computations, such as addition or subtraction.

After the pre-charging operation has concluded, the system 100 may ensure that the battery 105 is at the same SOC level as it was during step 815 (e.g., 50%) by charging or discharging the battery 105. Once the battery 105 has reached the desired SOC level, the fuel gauge circuit 110 may then measure and store a second voltage value $V_2$ and a second current value $I_{DD2}$ of the battery 105 (825). The fuel gauge circuit 110 may then compute a fourth internal resistance value R4 using the second voltage $V_2$ and the second current $I_{DD2}$ (i.e., $R4=V_2/I_{DD2}$) (830). The fourth internal resistance value represents the total internal resistance of the battery 105 that includes the initial internal resistance R0, the increase in internal resistance due to aging RA, and the increase in internal resistance due to over-discharging R1, if any. For example, the voltage sensor 130 and the current sensor 135 may measure the battery voltage and current, respectively, and transmit the measured values to the BCC 145, wherein the BCC 145 may perform any relevant computations, such as division or multiplication. The BCC 145 may transmit the computed fourth internal resistance value R4 to the memory to be stored. The fuel gauge circuit 110 may then compare the third internal resistance value R3 with the fourth internal resistance value R4 to determine if the battery recovery was successful. The recovery is successful if the first internal resistance value R1 goes to zero, and thus the fourth internal resistance R4 value will be equal to the third internal resistance value R3 after the pre-charging operation. For example, the BCC 145 may determine if the fourth internal resistance R4 is equal to the third internal resistance value R3 (835). If the fourth internal resistance R4 is equal to the third internal resistance value R3, this indicates that the battery capacity has been recovered to the level it was before the over-discharge (840). If the fourth internal resistance R4 is not equal to the third internal resistance value R3, this indicates that the battery capacity has not been fully recovered (845). In such a case, the system 100 may perform the pre-charging operation again.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the present technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery, comprising:
   a fuel gauge circuit comprising:
   a timer configured to generate a time count value;
   a first sub-circuit configured to determine a degree of an over-discharge event according to a battery characteristic value; and
   a second sub-circuit in communication with the first sub-circuit and the timer, and configured to:
      instruct a pre-charge mode, comprising:
         selecting a pre-charge time value based on the degree of the over-discharge event;
         generating a first control signal, wherein the first control signal indicates an instruction to begin a pre-charging operation of the battery; and
         generating a second control signal according to the selected pre-charge time value and the time count value, wherein the second control signal indicates an instruction to stop the pre-charging operation.

2. The apparatus according to claim 1, wherein the fuel gauge circuit further comprises a memory to store:
   a first predetermined data table comprising a set of first internal resistance values and correlated battery characteristic values that indicate varying degrees of over-discharge; and
   a second predetermined data table comprising a set of pre-charge time values and correlated battery characteristic values that indicate varying degrees of over-discharge.

3. The apparatus according to claim 2, wherein selecting the pre-charge time value based on the degree of the over-discharge event comprises extracting, from the second predetermined data table, the pre-charge time value that correlates to the degree of the over-discharge event.

4. The apparatus according to claim 2, wherein the first sub-circuit is further configured to confirm recovery of a capacity of the battery, comprising:
   determine a first internal resistance value based on the determined degree of the over-discharge event;

prior to beginning the pre-charging operation, measure a first voltage of the battery and a first current of the battery;
compute a second internal resistance value using the measured first voltage and the measured first current;
compute a third internal resistance value using the first and second internal resistance values;
after stopping the pre-charging operation, measure a second voltage and a second current of the battery;
compute a fourth internal resistance value using the measured second voltage and the measured second current; and
determine if the fourth internal resistance is equal to the third internal resistance.

5. The apparatus according to claim 4, wherein determining the first internal resistance value based on the determined degree of the over-discharge event comprises extracting, from the second predetermined data table, the first internal resistance value that correlates to the degree of the over-discharge event.

6. The apparatus according to claim 4, wherein computing the third internal resistance value comprises subtracting the first internal resistance value from the second internal resistance value.

7. The apparatus according to claim 1, further comprising a charger in communication with the fuel gauge circuit and configured to charge the battery according to the first control signal and the second control signal.

8. The apparatus according to claim 1, wherein the pre-charging operation is defined by a charge rate that is less than a charge rate used during a normal charging operation.

9. A method for restoring a loss in capacity of a battery, comprising:
confirming an occurrence of an over-discharge event, wherein the over-discharge event is defined as a state of charge value that is less than zero or an open circuit voltage value that is less than a predetermined threshold;
determining a degree of the over-discharge event;
selecting a pre-charge time value based on the degree of the over-discharge event; and
performing a pre-charge operation, comprising: charging the battery for a pre-charge period at a charge rate that is less than a charge rate used during a normal charging operation, wherein the pre-charge period is equal to the pre-charge time value.

10. The method according to claim 9, wherein determining the degree of the over-discharge event comprises retrieving at least one of the open circuit voltage value or the state of charge value from a memory.

11. The method according to claim 9, wherein selecting the pre-charge time value based on the degree of the over-discharge event comprises extracting, from a predetermined data table, the pre-charge time value that corresponds to the determined degree of the over-discharge event.

12. The method according to claim 9, further comprising confirming battery capacity recovery, comprising:
determining a first internal resistance value based on the determined degree of the over-discharge event;
prior to the pre-charge operation, measuring a first voltage of the battery and a first current of the battery;
computing a second internal resistance value using the measured first voltage and the measured first current;
computing a third internal resistance value using the first and second internal resistance values;
after the pre-charge operation has ended, measuring a second voltage and a second current of the battery;
computing a fourth internal resistance value using the measured second voltage and the measured second current; and
determining if the fourth internal resistance is equal to the third internal resistance value.

13. The method according to claim 12, wherein determining the first internal resistance value comprises extracting, from a predetermined data table, the first internal resistance value, from a set of internal resistance values, that correlates to the determined degree of the over-discharge event.

14. The method according to claim 12, wherein computing the third internal resistance value comprises subtracting the first internal resistance value from the second internal resistance value.

15. A system, comprising:
a rechargeable battery;
a fuel gauge circuit capable of connecting to the rechargeable battery and configured to:
restore loss of capacity of the battery comprising:
confirming an occurrence of an over-discharge event;
determining a degree of the over-discharge event according to a battery characteristic value; and
instructing a pre-charge mode comprising:
selecting a pre-charge time value based on the determined degree of the over-discharge event;
generating a first control signal that provides instructions to begin a pre-charging operation; and
generating a second control signal that provides instructions to stop the pre-charging operation; and
confirm restoration of the capacity of the battery; and
a charger capable of connecting to the rechargeable battery and capable of communicating with the fuel gauge circuit, wherein the charger is configured to perform the pre-charge operation according to the first control signal and the second control signal.

16. The system according to claim 15, wherein performing the pre-charge operation comprises charging the battery for a period of time at a charge rate that is less than a charge rate used during a normal charging operation, wherein the period of time is equal to the pre-charge time value.

17. The system according to claim 15, wherein the fuel gauge circuit comprises a memory to store:
a first predetermined data table comprising a set of first internal resistance values and correlated battery characteristic values that indicate varying degrees of over-discharge; and
a second predetermined data table comprising a set of pre-charge time values and correlated battery characteristic values that indicate varying degrees of over-discharge.

18. The system according claim 17, wherein selecting the pre-charge time value based on the degree of the over-discharge event comprises extracting, from the second predetermined data table, the pre-charge time value that correlates to the determined degree of the over-discharge event.

19. The system according to claim 17, wherein confirming restoration of the capacity of the battery, comprising:
determine a first internal resistance value comprising extracting, from the first predetermined data table, the first internal resistance value, from the set of internal resistance values, that correlates to the determined degree of the over-discharge event;
prior to beginning the pre-charge operation, measure a first voltage of the battery and a first current of the battery;

compute a second internal resistance value using the measured first voltage and the measured first current;

compute a third internal resistance value using the first and second internal resistance values;

after stopping the pre-charge operation, measure a second voltage and a second current of the battery;

compute a fourth internal resistance value using the measured second voltage and the measured second current; and determine if the fourth internal resistance is equal to the third internal resistance.

20. The system according to claim 19, wherein:

computing the third internal resistance value comprises subtracting the first internal resistance value from the second internal resistance value;

computing the second internal resistance value comprises dividing the measured first voltage by the measured first current; and computing the fourth internal resistance comprises dividing the measured second voltage by the measured second current.

\* \* \* \* \*